United States Patent
Getman et al.

(10) Patent No.: US 8,266,507 B2
(45) Date of Patent: Sep. 11, 2012

(54) DATA PROCESSING APPARATUS FOR OPERATING LENS CORRECTION AND METHOD FOR COMPRESSING AND RESTORING LOOKUP TABLE VALUES

(75) Inventors: Alexander Getman, Yongin-si (KR); Andrey Lukyanov, Suwon-si (KR); Kyu-Min Kyung, Seoul (KR); Bong Ki Son, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 971 days.

(21) Appl. No.: 12/271,049

(22) Filed: Nov. 14, 2008

(65) Prior Publication Data

US 2009/0160978 A1 Jun. 25, 2009

(30) Foreign Application Priority Data

Nov. 16, 2007 (KR) .................. 10-2007-0117271
Mar. 3, 2008 (KR) .................. 10-2008-0019461

(51) Int. Cl.
*G06F 11/00* (2006.01)
(52) U.S. Cl. ........................................ 714/781
(58) Field of Classification Search ............ 714/781
See application file for complete search history.

(56) References Cited

U.S. PATENT DOCUMENTS

| | | | | |
|---|---|---|---|---|
| 3,508,196 A * | 4/1970 | Brown et al. | .............. | 714/771 |
| 3,805,232 A * | 4/1974 | Allen | .............. | 714/779 |
| 5,489,940 A | 2/1996 | Richardson et al. | | |
| 5,938,787 A * | 8/1999 | Stark | .............. | 714/755 |
| 6,466,304 B1 | 10/2002 | Smith | | |
| 6,651,213 B2 * | 11/2003 | Hassner et al. | .............. | 714/763 |
| 6,795,897 B2 | 9/2004 | Benveniste et al. | | |
| 7,979,780 B2 * | 7/2011 | Kamiya | .............. | 714/781 |
| 2002/0178421 A1 * | 11/2002 | Hassner et al. | .............. | 714/781 |
| 2010/0199153 A1 * | 8/2010 | Okamura et al. | .............. | 714/781 |

FOREIGN PATENT DOCUMENTS

| | | |
|---|---|---|
| JP | 06-141299 | 5/1994 |
| JP | 2001-211331 | 8/2001 |
| JP | 2005-242035 | 9/2005 |

* cited by examiner

*Primary Examiner* — Bryce Bonzo
(74) *Attorney, Agent, or Firm* — F. Chau & Associates, LLC

(57) ABSTRACT

A data processing apparatus having a small hardware size and performing lens correction includes a seed memory, a gain memory, and a decoder. The seed memory stores a plurality of encoded gain values forming an A*B seed matrix; the gain memory stores a plurality of decoded gain values forming an M*N grid matrix. The decoder is connected between the seed memory and the gain memory and performs vertical recursive rear polynomial (RNP) decoding before performing horizontal RNP decoding after a second time. Accordingly, the decoder may decode the M*N grid matrix from the A*B seed matrix by performing the row directional RNP decoding and the column directional RNP decoding by turns.

18 Claims, 13 Drawing Sheets

$G = G1*y*x$
$\quad +G2*(1-x)*y$
$\quad +G3*x*(1-y)$
$\quad +G4*(1-x)*(1-y)$

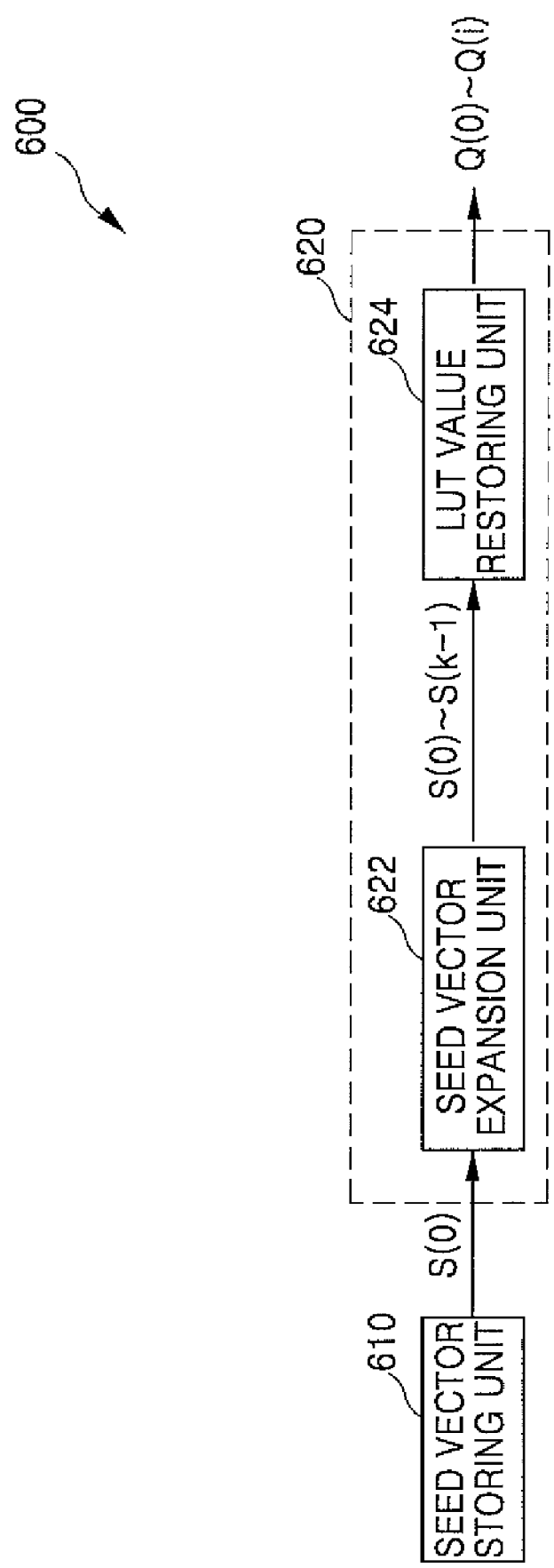

DATA PROCESSING APPARATUS FOR OPERATING LENS CORRECTION AND METHOD FOR COMPRESSING AND RESTORING LOOKUP TABLE VALUES

CROSS-REFERENCE TO RELATED APPLICATIONS

This application claims priority under 35 U.S. Section 119 to Korean Patent Application No. 10-2007-0117271 filed Nov. 16, 2007, and No. 10-2008-0019461 filed Mar. 3, 2008, the disclosures of which are incorporated herein by reference.

BACKGROUND

1. Technical Field

Exemplary embodiments of the present invention relate to the technique of data correction and, more particularly, to a decoder capable of decoding encoded data by using adding and shifting operations in a Recursive Near Polynomial (RNP) method and a data processing apparatus including the decoder. Exemplary embodiments of the present invention also relate to digital signal processing and, more particularly, to a method for compressing and restoring lookup table values to be subsequently stored in a lookup table using a recursive near polynomial (RNP) equation.

2. Discussion of Related Art

In an image processing apparatus, such as an image sensor, it is required to transmit more information from a host to a data processing apparatus performing lens correction in order to perform a more precise lens correction.

Lens correction typically means unifying light intensity of an image center and the light intensity of an edge to cope with a physical phenomenon caused by the lens and a pixel, that is, a phenomenon that light intensity decreases as it goes out from an image center that is, a center of the lens, to an edge of the image.

Information transmission time is a very sensitive subject in a usable system. The more information that is transmitted, the longer the transmission time that is required. Therefore, to reduce information transmission time, data should be compressed or encoded and then transmitted.

Compressed information is decoded in a decoder of a data processing apparatus performing lens correction. A conventional decoder has a complex hardware structure, because it performs many multiplying operations. Therefore, it is difficult to embody a conventional decoder in a small hardware size.

A lookup table (LUT) is widely used in performing digital signal processing algorithms. The LUT is used to effectively represent a functional dependence between the sets of input and output parameters in the implementation of the software and/or hardware of the algorithms. The functional dependence between one input parameter and one output parameter can be represented by a one-dimensional LUT. The functional dependence between two input parameters and one output parameter can be represented by a two-dimensional LUT.

Interpolation can be used to obtain a continuous functional dependence from a lookup table representation. The LUT values can be randomly or sequentially accessed by the digital signal processing algorithms. When the LUT values are sequentially accessed, an input parameter value may continuously vary within a range of effective parameter values. Although the LUT can be used to improve performance of the digital signal processing algorithms, aside from the performance, there may be other restrictions on the efficiency of the LUT. One of the restrictions is the memory capacity, or the memory size, that is occupied by the LUT.

The memory footprint of a LUT can be reduced by the introduction of data compression and decompression units. To perform the method, however, additional, complicated hardware logic and/or software codes are needed.

Polynomial regression can be used to reduce the memory capacity of the LUT. In this case, coefficients of a polynomial regression equation appropriate for a LUT value can be stored in a memory so that the memory capacity of the LUT can be reduced. It can be problematic, however, that a large number of multiplications are needed to restore the LUT values from the coefficients of the polynomial regression equation. This problem can degrade performance in the execution of the software to restore the LUT values from the coefficients of the polynomial regression equation and can increase costs for the implementation of hardware.

SUMMARY

Exemplary embodiments of the present invention provide a decoder having a small hardware size for decoding transmitted information in a short period of time and a data processing apparatus including the decoder. Also, exemplary embodiments of the present invention provide a method for compressing and restoring data that improves performance in compressing and restoring lookup table values through polynomial regression and reduces costs for the implementation of hardware.

An exemplary embodiment of the present invention is directed to a data processing apparatus, including a seed memory storing a plurality of encoded gain values forming an A (A is natural number)*B (B is a natural number) seed matrix, a gain memory storing a plurality of decoded gain values forming an M (M is a natural number, M>A)*N (N is a natural number, N>B) grid matrix, and a decoder.

The decoder is connected between the seed memory and the gain memory and, before decoding each of a plurality of decoded gain values forming an $i^{th}$ row (i is a natural number, $2 \leq i \leq M$) of the M*N grid matrix from a plurality of encoded gain values forming a first row of the A*B seed matrix, the decoder updates at least a part of the plurality of encoded gain values forming the A*B seed matrix based on two gain values close to each other in each column direction among the plurality of encoded gain values forming the A*B seed matrix.

The decoder decodes each of the plurality of decoded gain values forming the ithrow (i is a natural number, $2 \leq i \leq M$) of the M*N grid matrix from a plurality of encoded gain values, which form the first row of the A*B seed matrix and which are updated.

The data processing apparatus further includes a calculation block outputting data corrected by performing bilinear interpolation on input data based on a plurality of reference gain values among the plurality of decoded gain values output from the gain memory. The data processing apparatus is an apparatus performing lens correction, and it can be embodied as a part of an image processing apparatus.

An exemplary embodiment of the present invention is directed to a data processing apparatus, including a plurality of register blocks, which are connected in series and which may perform the data shifting operation, respectively, a shift block for shifting first L-bit data (L is a natural number) stored in a second register block 302 among the plurality of register blocks as much as a K-bit shift (K is a natural number) and outputting shifted first L-bit data, an adder for generating third L-bit data by adding the shifted first L-bit data and second L-bit data stored in a first register block, among the plurality of register blocks, and outputting generated third L-bit data to a last register block among the plurality of register blocks, and a switching block outputting third L-bit data shifted to the first register block in response to a control signal output from a controller, whenever the third L-bit data is shifted to the first register block via the operation shifting data.

The data processing apparatus further includes a seed memory storing a plurality of encoded gain values and a gain memory storing a plurality of decoded gain values.

The controller controls storing a first set of gain values among the plurality of encoded gain values in the plurality of register blocks and controls the operation of the switching block by generating the control signal until a second set of gain values, among the plurality of decoded gain values, is stored in the gain memory.

The controller further performs an operation updating at least a part of the plurality of encoded gain values by using two gain values close to each other in each column direction, among the plurality of encoded gain values. The first set of gain values is gain values updated through the updating operation, respectively.

The data processing apparatus filer includes a calculation block outputting data corrected by performing bilinear interpolation with regard to input data based on a plurality of reference gain values, among the plurality of decoded gain values, output from the gain memory.

According to an exemplary embodiment of the present invention, a method for compressing and restoring data in one-dimensional data comprises setting an initial seed vector corresponding to an initial condition for a Cauchy problem that defines a polynomial regression to compress a plurality of original function values (LUT data) sampled from a original function in a lookup table, generating a seed vector corresponding to each of the original function values based on the set initial seed vector, that is, a seed vector expansion operation, and restoring a corresponding original function value based on a corresponding seed vector of the seed vectors generated in the seed vector expansion operation.

More specifically, the method comprises presenting the polynomial regression of the data as initial conditions of a Cauchy problem for a differential equation that has the regression polynomial as a solution and solving this Cauchy problem by a standard numerical iterative method. In this exemplary embodiment the initial conditions are the compressed representation of the function of one argument given by the LUT and are referred to as an initial seed vector in the following description. The data obtained through the iterative numerical solution of the Cauchy problem is the approximation of the original data in a LUT and is referred to as restored (from the initial seed vector) LUT data. The process of restoration of the LUT data is referred to as a recursive near-polynomial (RNP) expansion of the initial seed vector.

The method her comprises setting the initial seed vector based on the residual error between the restored function values and the corresponding original function values.

Computation of the initial seed vector is obtained through the minimization of residual error between the original LUT data and the LUT data obtained through the RNP expansion of this initial seed vector. This process is referred to as RNP compression of the original one-dimensional LUT data into the initial seed vector.

An exemplary embodiment of a method for compressing and restoring two-dimensional data comprises setting a first seed matrix to compress function values in a two-dimensional matrix form sampled from a function having two arguments, generating a second seed matrix using a one-dimensional RNP expansion based on each of the first arrays of the first seed matrix, and restoring the function values in the sampled two-dimensional matrix form using the one-dimension RNP expansion based on each of second arrays of the generated second seed matrix.

The above-described method is generalized to the two-dimensional LUT case through the cascaded application of the RNP expansion process. During a first stage, each column of the first seed matrix is treated as an initial seed vector and is expanded to generate columns of the second seed matrix. During a second stage, every row of the generated second seed matrix is treated again as a second initial seed vector that is, in turn, expanded to form elements of a restored two-dimensional LUT. In this exemplary embodiment, the first seed matrix is the compressed form of the two-dimensional LUT and is referred to as an initial seed matrix, The cascaded process of computation of the elements of the original two-dimensional LUT is referred to as an RNP expansion of the initial seed matrix.

As in the one-dimensional case, the two-dimensional generalization further comprises computation of the initial seed matrix through the minimization of residual error between the original two-dimensional LUT data and the LUT data obtained through the RNP expansion of this initial seed matrix. This process is referred to as an RNP compression of the original two-dimensional LUT data into the initial seed matrix.

BRIEF DESCRIPTION OF THE DRAWINGS

Exemplary embodiments of the present invention will be understood in more detail from the following descriptions taken in conjunction with the accompanying drawings, in which:

FIG. 13 is a block diagram of the digital signal processor for storing and restoring lookup table values according to an exemplary embodiment of the present invention.

DETAILED DESCRIPTION OF EXEMPLARY EMBODIMENTS

Figure 1:
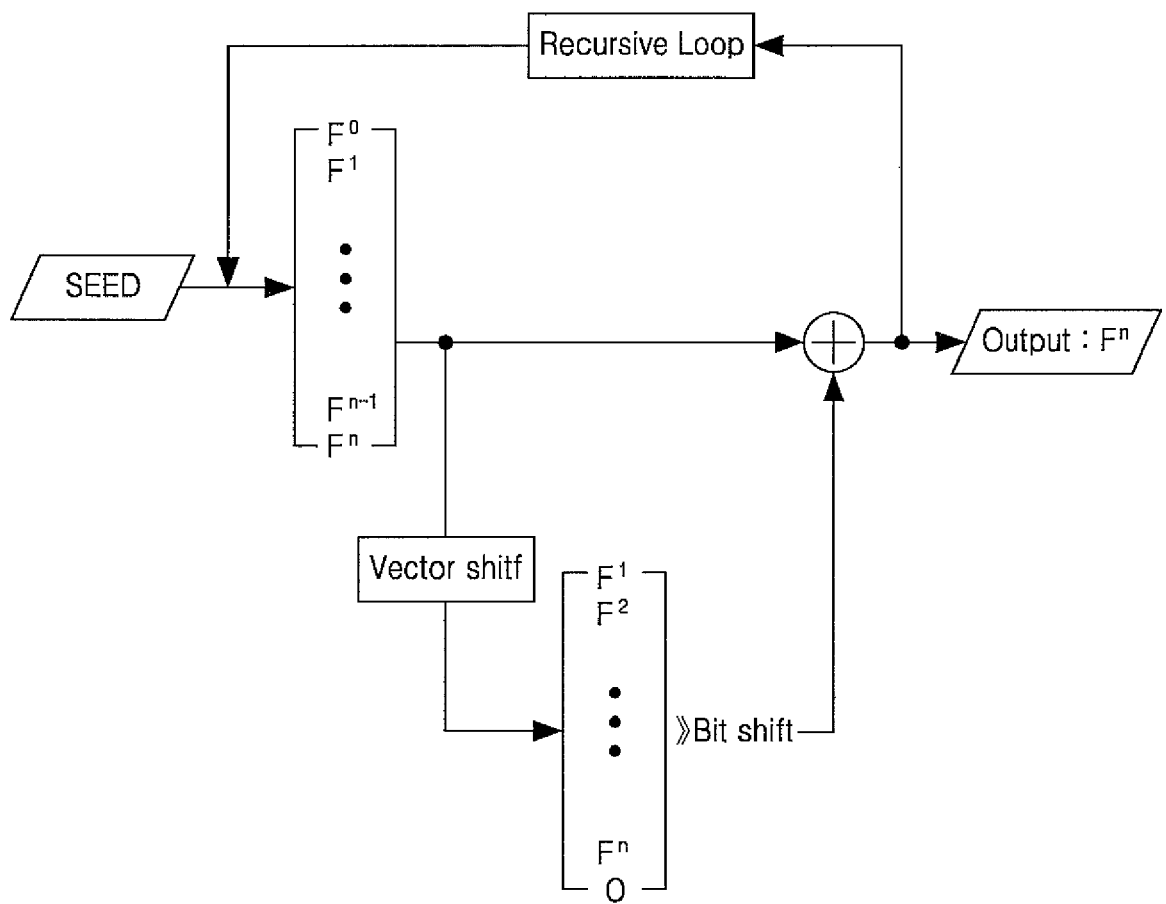
FIG. 1 shows a standard structure of hardware embodying a one-dimensional RNP algorithm.

This application claims priority under 35 U.S.C. § 119 from Korean Patent Application Nos. 10-2007-0117271, filed on Nov. 16, 2007, and 10-2008-0019461, filed on Mar. 3, 2008, the disclosure of which is incorporated by reference herein.

Reference will now be made in detail to the exemplary embodiments of the present general inventive concept, examples of which are illustrated in the accompanying drawings, wherein like reference numerals refer to like elements throughout. The exemplary embodiments are described below in order to explain the present general inventive concept by referring to the figures.

A concept of Recursive Near Polynomial (RNP) used in a decoder or a data processing apparatus according to an exemplary embodiment of the present invention is as set forth below.

Equation 1 shows a basic concept of a one-dimensional RNP.

$$F = F + \frac{dF}{dx} * h_1 \quad \text{(Equation 1)}$$
$$\frac{dF}{dx} = \frac{dF}{dx} + \frac{d^2F}{dx^2} * h_2$$
$$\vdots \quad \vdots \quad \vdots$$
$$\frac{d^{n-1}F}{dx^{n-1}} = \frac{d^{n-1}F}{dx^{n-1}} + \frac{d^nF}{dx^n} * h_{n-1}$$
$$\frac{d^nF}{dx^n} = \frac{d^nF}{dx^n}$$

As shown in equation 1, there are n differential functions (here, n is a natural number) in a one-dimensional RNP. A value of an $M^{th}$-degree differential function (here, M is a natural number, M<n) is determined by adding a value of an $M^{th}$-degree differential function and a value resulting from multiplying a value of an $(m+1)^{th}$-degree differential function and a constant number $h_{m+1}$. For example, a value of a first-degree differential function dF/dx is determined by adding a value of the first-degree differential function dF/dx and a value resulting from multiplying a value of a second-degree differential function $d^2F/dx^2$ and a constant number $h_2$.

As shown in equation 1, a shape in which a value of an $m^{th}$-degree differential function varies is similar to a shape that a value of an $m^{th}$-degree function varies. For example, a shape that a value of a second-degree differential function changes is similar to a shape in which a value of a second-degree function changes.

A value of a final result, which is used in a decoder or a data processing apparatus including the decoder according to an exemplary embodiment of the present invention, is a value of an F function. How a value of an F function is changed is similar to how an $n^{th}$-degree function is changed. As a result, 0, 1, 2, . . . , $(n-1)^{th}$, and the $n^{th}$-degree function may be embodied by repeatedly performing the operations of multiplication and addition.

Equation 2 shows equation 1 displayed in a time concept.

$$\begin{bmatrix} F_t^0 \\ F_t^1 \\ \vdots \\ F_t^{n-1} \\ F_t^n \end{bmatrix} = \begin{bmatrix} F_{t-1}^0 \\ F_{t-1}^1 \\ \vdots \\ F_{t-1}^{n-1} \\ F_{t-1}^n \end{bmatrix} + \begin{bmatrix} F_{t-1}^1 \\ F_{t-1}^2 \\ \vdots \\ F_{t-1}^n \\ 0 \end{bmatrix} * h \quad \text{(Equation 2)}$$

In equation 2, $F^0_t$ represents an F function of equation 1; $F^1_t$ represents a first-degree differential function value dF/dx; $F^2_t$ represents a second-degree differential function value $d^2F/dx^2$. t represents time when a function value is made.

If we suppose that all of $h_1, h_2, \ldots, h_{n-2}, h_{n-1}$, h are the same, a hardware size of a decoder will be reduced. Each constant number $h_1, h_2, \ldots, h_{n-2}, h_{n-1}$ may have a different value from each other, however, according to an exemplary embodiment.

Figure 2:
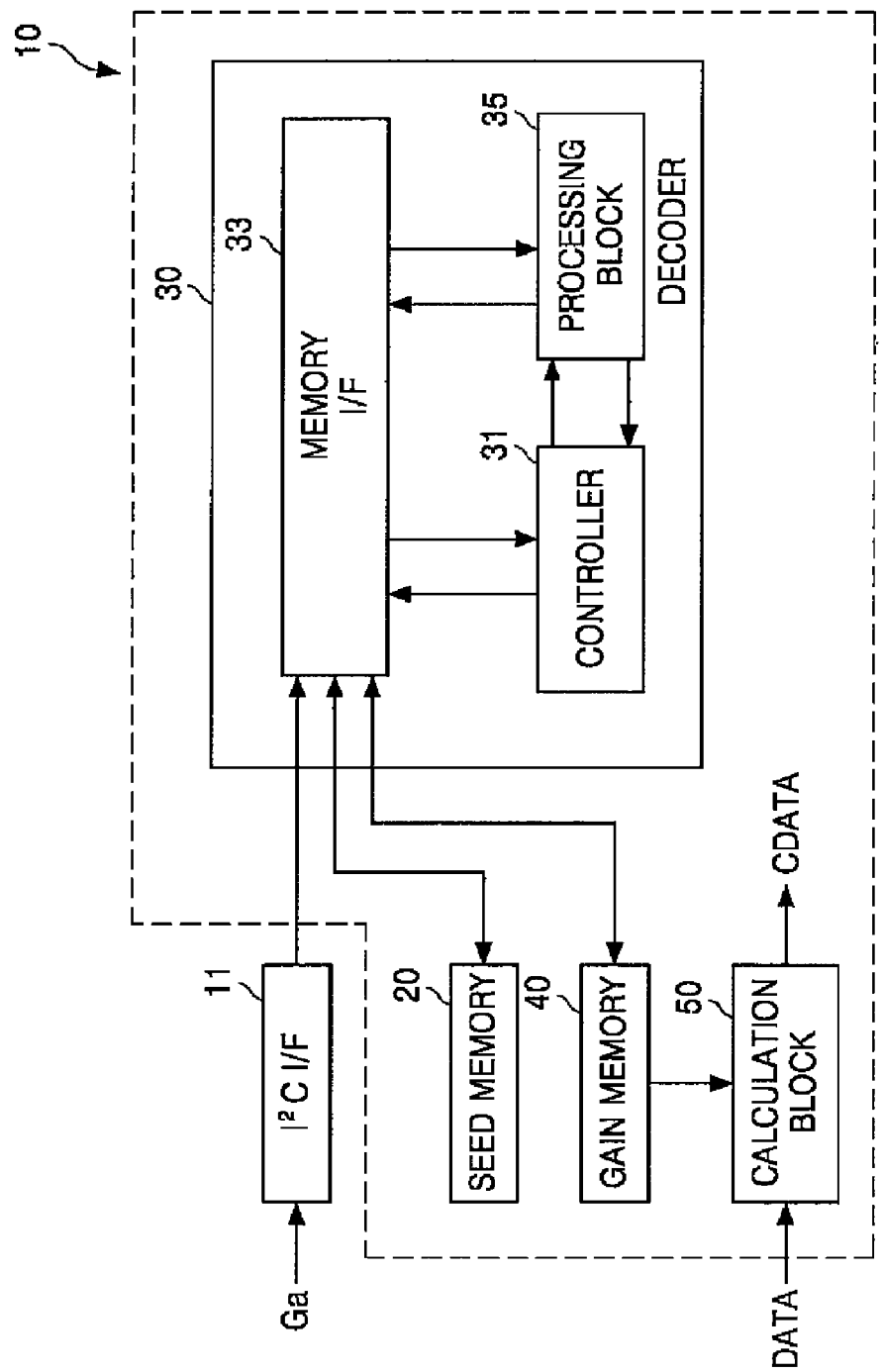
FIG. 2 shows a block diagram of a data processing apparatus according to an exemplary embodiment of the present invention.

FIG. 1 shows an example embodying equation 2 in hardware. Seed values comprised of (n+1) values are expressed as $[F^0, F^1, \ldots, F^{n-1}, F^n]$ in FIG. 1. Additionally, h (a constant number) displayed in FIG. 2 is expressed as ">>BitShift". Thereby, a hardware size of a decoder according to an exemplary embodiment of the present invention is further reduced.

The algorithm of a one-dimensional RNP is explained above. A decoder according to an exemplary embodiment of the present invention uses a two-dimensional RNP applying the algorithm of the above-described one-dimensional RNP to a row direction and a column direction.

FIG. 2 shows a block diagram of a data processing apparatus according to an exemplary embodiment of the present invention. A data processing apparatus 10, which is capable of performing lens correction, may be embodied in an image processing apparatus, such as an image sensor.

Referring to FIG. 2, the data processing apparatus 10 includes a seed memory 20, a decoder 30, a gain memory 40, and a calculation block 50. A plurality of encoded gain values Ga input through an external interface 11 is stored in a seed memory 20 via a memory interface 33 under the control of a controller 31. In exemplary embodiment, an interface according to the I²C protocol may be used as the external interface 11.

The seed memory 20 stores a plurality of encoded gain values expressed as an A*B matrix (hereinafter "A*B seed matrix"). In this exemplary embodiment, both A and B are natural numbers and are assumed to be 6 for convenience of explanation. Accordingly, the seed memory 20 may store at least 36 encoded gain values in total. In this exemplary embodiment, 36 encoded gain values are respectively supposed to be L-bit data (L is a natural number, for example, L is 20).

The decoder 30 reads out necessary encoded gain values from the seed memory 20 at the proper time, generates or decodes each of a plurality of decoded gain values in order, which are expressed by an M*N matrix (hereinafter, "M*N grid matrix"), by using a hardware structure illustrated in FIG. 4, and stores generated or decoded gain values in the gain memory 40 under the control of the controller 31. In this exemplary embodiment, M and N are natural numbers and are respectively assumed to be 11 and 13 for convenience of explanation.

Therefore, the gain memory 40 stores a plurality of decoded gain values expressed by an 11*13 grid matrix. That is, the decoder 30 of an exemplary embodiment of the present invention decodes a 6*6 seed matrix to an 11*13 grid matrix by performing horizontal RNP decoding and vertical RNP decoding by turns.

That is, a data processing apparatus 10 according to an exemplary embodiment of the present invention is connected between the seed memory 20 and the gain memory 40 and, before decoding each of a plurality of decoded gain values forming an $i^{th}$ row (i is a natural number, $2 \leq i \leq M$) of an M*N grid matrix from a plurality of encoded gain values forming a first row of an A*B seed matrix, updates at least a part of the plurality of encoded gain values forming the A*B seed matrix based on two gain values close to each other in each column direction, among the plurality of encoded gain values forming the A*B seed matrix.

For example, the data processing apparatus 10 of FIG. 2 performs vertical RNP decoding before performing horizontal RNP decoding after a second time.

The calculation block 50 compensates image data DATA based on gain values output from the gain memory 40, for example, four gain values that will be explained by referring to FIGS. 6 and 7, and outputs compensated image data CDATA.

For example, the calculation block 50 calculates a gain value corresponding to a pixel by using bilinear interpolation, which will be explained by referring to FIGS. 6 and 7, multiplies a calculated gain value and the image data DATA, and outputs the compensated image data CDATA as a result of the multiplication. For example, the calculation block 50 may adjust light intensity for each channel by using a gain value calculated via bilinear interpolation to perform lens correction.

Figure 3:
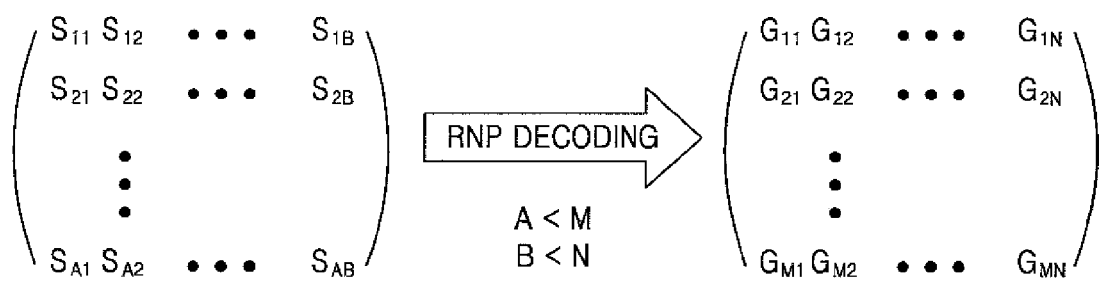
FIG. 3 is a diagram conceptually explaining an operation of a decoding processing block illustrated in FIG. 2.

FIG. 3 is a representation explaining conceptually the operation of a decoding processing block illustrated in FIG. 2; FIG. 4 shows a block diagram of the decoding processing block illustrated in FIG. 2; FIG. 5 is a diagram explaining conceptually the operation of the decoder illustrated in FIG. 2.

Initially, each figure (from 0 to 35) in a circle displayed in FIG. 5 indicates an address of a storage section of the seed memory 20 of FIG. 2 in which each encoded gain value is stored. For example, each gain value $S_{11}$, $S_{21}$, $S_{41}$, $S_{12}$, $S_{22}$, $S_{A2}$, $S_{1B}$, $S_{2B}$, and $S_{AB}$ displayed in FIG. 3 is stored in each figure 35, 34, 30, 29, 28, 5, 4, and 0 displayed in FIG. 5.

Figure 4:
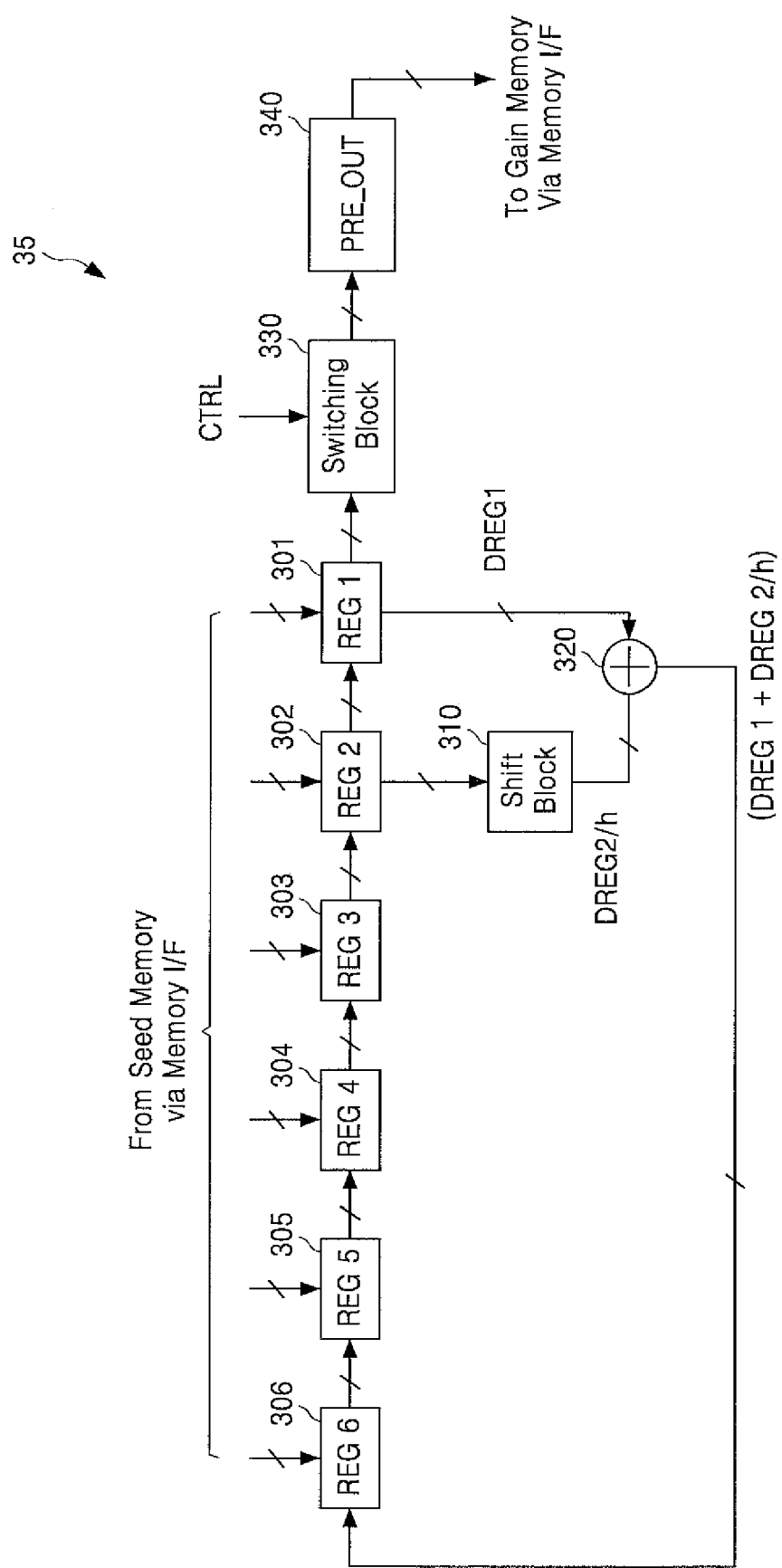
FIG. 4 shows a block diagram of a decoding processing block illustrated in FIG. 2.
Figure 5:
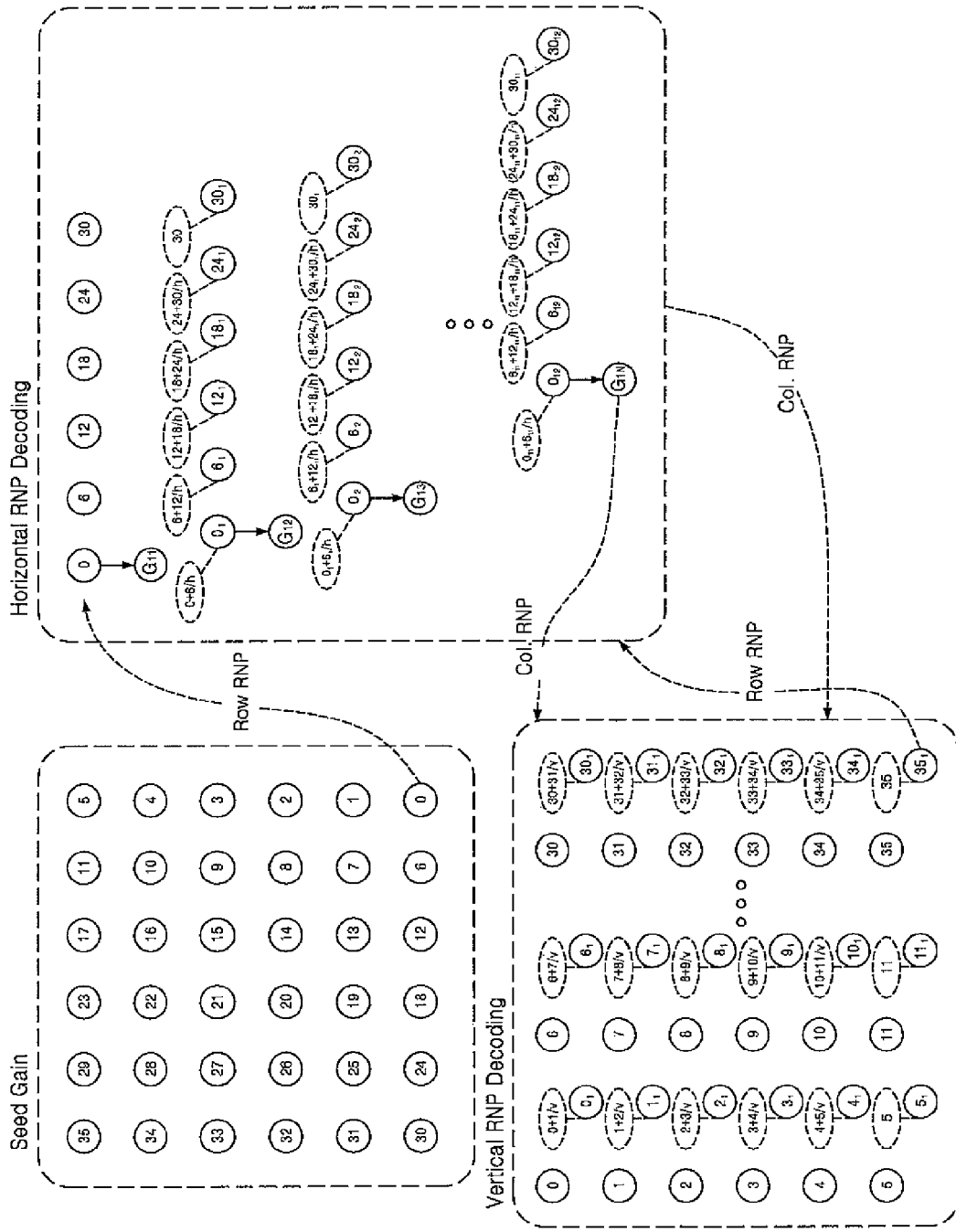
FIG. 5 is a diagram conceptually explaining an operation of a decoder illustrated in FIG. 2.

To figure out each of the elements in a first row of an 11*13 grid matrix, that is, each of a plurality, for example, 13 of decoded gain values $G_{11}$, $G_{12}$, ..., $G_{1N}$ illustrated in FIG. 3, a plurality of encoded gain values $S_{A1}$, $S_{A2}$, ..., $S_{AB}$ in a first row, stored in each address 0, 6, 12, 18, 24, and 30 of the seed memory 20 under the control of the controller 31, are respectively stored in a corresponding register block among a plurality of register blocks 301, 302, 302, 304, 305, and 306 shown in FIG. 4 via a memory interface 33 shown in FIG. 2.

The plurality of register blocks 301 to 306 includes L registers storing L-bit parallel data (L is a natural number, for example, L is 20), respectively. Each of the L registers stores one corresponding data among L-bit parallel data in response to a clock signal.

For convenience of explanation, each address (from 0 to 35) and the encoded gain value stored in each address are expressed the same in FIGS. 4 and 5.

For example, a gain value $S_{AB}$ stored in an address of 0 is expressed as 0; a gain value-$S_{A1}$ stored in an address of 30 is expressed as 30; a gain value $S_{A2}$ stored in an address of 24 is expressed as 24.

Accordingly, under control of the controller 31, 0, 6, 12, 18, 24 and 30 are respectively stored in a first register block 301, a second register block 302, a third register block 303, a fourth register block 304, a fifth register block 305 and a sixth register block 306.

The switching block 330 outputs 0 stored in a register block 301 to an output register block 340 in response to a control signal CTRL output from the controller 31 shown in FIG. 2. 0 stored in the output register block 340 is transmitted to a gain memory 40 via a memory interface 33 under the control of the controller 31. Here, 0 transmitted to the gain memory 40 is a decoded gain value $G_{11}$.

The shift block 310 receives a gain value output from a second register block 302, shifts L-bit data, for example, L is 20, forming a received gain value to the right as K-bit (K is a natural number, for example, K is 3), and outputs 20-bit data that is shifted as much as 3 bits.

For example, the shift block 310 may discard a first data value 0 to a third data value 0 among original 20-bit data, for example, 10000000001111111000, and use a $20^{th}$ data value 1 as a $20^{th}$ data value to a $17^{th}$ data value according to the 3-bit shifting operation. Accordingly, the shift block 310 outputs 3-bit shifted 20-bit data, for example, 11110000000001111111, to an adder 320 shown in FIG. 4.

The adder 320 adds 20-bit data DREG1=0 output from the first register 301 and 20-bit data DREG2/h (=6/h) output from the shift block 310 and outputs 20-bit data DREG1+DREG2/h (=0+(6/h)) generated according to a result of the addition to the sixth register block 306. Here, h is $2^K$.

Accordingly, the sixth register block 306 stores 20-bit data DREG1+DREG2/h (=0+6/h) output from the adder 320. 20-bit data stored in each of the sixth register block 306, the fifth register block 305, the fourth register block 304, the third register block 303 and the second register block 302 are simultaneously shifted to the fifth register block 305, the fourth register block 304, the third register block 303, the second register block 302, and the first register block 301, respectively. Each of the register blocks 301 to 306 performs a right shifting operation in response to a clock signal.

20-bit data DREG1+DREG2/h (=0+(6/h)) output from the adder 320 is shifted in the order of the sixth register block 306, the fifth register block 305, the fourth register block 304, the third register block 303, and the second register block 302 sequentially and then is finally shifted to the first register block 301.

While 20-bit data DREG1+DREG2/h (=0+(6/h)) output from the adder 320 is shifted in order of the sixth register block 306, the fifth register block 305, the fourth register block 304, the third register block 303, and the second register block 302 successively, the switching block 330 keeps in OFF state in response to the control signal CTRL.

When 20-bit data DREG1+DREG2/h (=0+(6/h)) output from the adder 320 is shifted to a first register block 301 or after being shifted, however, the switching block 330 stays in the ON state in response to the control signal CTRL. Consequently, 20-bit data DREG1+DREG2/h, that is, 0+(6/h), shifted to the first register block 301 is output to the output register block 340 via the switching block 330 staying in the ON state. A decoded gain value 0+(6/h) stored in the output register block 340 is transmitted to the gain memory 40 via the memory interface 33 shown in FIG. 2 under the control of the controller 31. Here, the decoded gain value 0+(6/h) transmitted to the gain memory 40 is $G_{12}$.

For example, the controller 31 may generate the control signal CTRL controlling the switching block 330 to be in the ON state whenever a value output from the adder 320 is transmitted to the first register 301 via the sixth register 306 to the second register 302.

$0_1$ illustrated in FIG. 5 indicates a gain value stored in the first register block 301 through the successive shifting operation; $6_1$ (=6+(12/h)) indicates a gain value stored in the second register block 302 when $0_1$ is stored in the first register block 301; $12_1$ (=12+(18/h)) indicates a gain value stored in the third register block 303 when $0_1$ is stored in the first register block 301; $18_1$ (=18+(24/h)) indicates a gain value stored in the fourth register block 304 when $0_1$ is stored in the first register block 301; $24_1$ (=24+(30/h)) indicates a gain value stored in the fifth register block 305 when $0_1$ is stored in the first register block 301; and $30_1$ (=30) indicates a gain-value stored in the sixth register block 306 when $0_1$ is stored in the first register block 301.

Continuously, the shift block 310 receives a gain value $6_1$ output from the second register block 302, shifts 20-bit data forming a received gain value $6_1$ to the right as much as a 3-bit shift, and outputs 3-bit shifted 20-bit data $6_1/h$.

The adder 320 adds 20-bit data DREG1 (=$0_1$) output from the first register block 301 and 20-bit data DREG2/h (=$6_1/h$) output from the shift block 310, and outputs 20-bit data DREG1+DREG2/h (=$0_1+(6_1/h)$) generated according to a result of the addition to the sixth register block 306.

As described above, 20-bit data DREG1+DREG2/h, i.e., $0_1+(6_1/h)$, output from the adder 320 is shifted in order of the sixth register block 306, the fifth register block 305, the fourth register block 304, the third register block 303, and the second register block 302 sequentially and then is finally shifted to the first register block 301.

While 20-bit data DREG1+DREG2/h, i.e., $0_1+(6_1/h)$, output from the adder 320 is shifted in order of the sixth register block 306, the fifth register block 305, the fourth register block 304, the third register block 303, and the second register block 302 sequentially, the switching block 330 stays in the OFF state in response to the control signal CTRL.

When 20-bit data DREG1+DREG2/h, that is, $0_1+(6_1/h)$, output from the adder 320 is shifted to the first register block 301 or after being shifted, the switching block 330 stays in the ON state in response to the control signal CTRL. Accordingly, 20-bit data DREG1+DREG2/h, that is, $0_1+(6_1/h)$, shifted to the first register block 301 is output to the output register block 340 via the switching block 330 staying in the ON state. The decoded gain value $0_1+(6_1/h)$ stored in the output register block 340 is transmitted to the gain memory 40 via the memory interface 33 under the control of the controller 31 shown in FIG. 2. Here, the decoded gain value $0_1+(6_1/h)$ transmitted to the gain memory 40 is $G_{13}$.

$0_2$ illustrated in FIG. 5 indicates a gain value stored in the first register block 301 through a successive shifting operation; $6_2(=6_1+(12_1/h))$ indicates a gain value stored in the second register block 302 when $0_2$ is stored in the first register block 301; $12_2(=12_1+(18_1/h))$ indicates a gain value stored in the third register block 303 when $0_2$ is stored in the first register block 301; $18_2(=18_1+(24_1/h))$ indicates a gain value stored in the fourth register block 304 when $0_2$ is stored in the first register block 301; $24_2(=24_1+(30_1/h))$ indicates a gain value stored in the fifth register block 305 when $0_2$ is stored in the first register block 301; and $30_2(=30_1)$ indicates a gain value stored in the sixth register block 306 when $0_2$ is stored in the first register block 301.

At $N^{th}$ operation, that is, the operation of outputting a thirteenth decoded gain value GIN, a thirteenth decoded gain value $0_{12}=0_{11}+6_{11}/h$ is stored in the first register block 301. The thirteenth decoded gain value $0_{12}=0_{11}+6_{11}/h$ stored in the first register 301 is output to the output register block 340 via the switching block 330 staying in the ON state.

Consequently, the thirteenth decoded gain value $0_{12}=0_{11}+6_{11}/h$ is stored in the gain memory 40 via the memory interface 33 under the control of the controller 31.

As described above, the decoder 30 according to an exemplary embodiment of the present invention may calculate N gain values $G_{11}, G_{12}, \ldots, G_{1N}$ forming a first row of an M*N grid matrix from B gain values $S_{A1}, S_{A2}, \ldots, S_{AB}$ forming a first row of an A*B seed matrix. This is called row directional (or, horizontal) RNP decoding.

Once decoding for a plurality of gain values forming one row is completed by the row directional (or horizontal) RNP decoding, an updating process for encoded gain values stored in a seed memory 20 is performed. This is called column directional (or vertical) RNP decoding.

Referring to FIGS. 2 and 5, column directional RNP decoding is explained as follows.

First of all, the process of updating each of a plurality of gain values 0 to 5 forming a first column of a 6*6 seed matrix is explained as follows.

The controller 31 reads out two gain values 0 and 1 stored in the seed memory 20 via the memory interface 33, calculates ($0_1$=0+1/v) through a shifting operation and an adding operation for the values 0 and 1 using the decoding process block 35, and overwrites a result of the calculation $0_1$ in a memory section in which an original gain value 0 is stored via the memory interface 33 (this is defined as "update"). Here, v may be the same as h. For example, v is $2^K$.

For instance, the decoding process block 35 for performing column directional RNP decoding may further include components substantially the same as, or similar to, components 301 to 340 illustrated in FIG. 4. In this case, components for performing column directional RNP decoding may perform column directional decoding under the control of the controller 31. Even in this event, a result of the addition by the adder 320 is updated in the seed memory 20 via the memory interface 33.

After a gain value 0 is updated to a new gain value $0_1$, the controller 31 reads out two gain values 1 and 2 stored in the seed memory 20 via the memory interface 33, calculates ($1_1$=1+2/v) through a shifting operation and an adding operation with regard to the values 1 an 2 by using the decoding processing block 35, and updates a result of the calculation $1_1$ in a section in which an original gain value 1 is stored via the memory interface 33.

After a gain value 1 is updated to a new gain value $1_1$, the controller 31 reads out two gain values 2 and 3 stored in the seed memory 20 via the memory interface 33, calculates ($2_1$=2+3/v) via the shifting and the adding operation with regard to the values 2 and 3 by using the decoding processing block 35, and updates a result of the calculation $2_1$ in a section in which an original gain value 2 is stored via the memory interface 33.

After a gain value 4 is updated to a new gain value 41 in the same way, the controller 31 reads out a gain value 5 stored in the seed memory 20 via the memory interface 33 and again stores the gain value 5 in a section where an original gain value 5 is stored.

When the decoder 30 performs the shifting and the adding operation (B−1) times, that is, 5 times, gain values for a first column are updated.

When column directional decoding for a first column is completed, the decoder 30 performs column directional decoding, which updates each of a plurality of gain values 6 and 7 forming a second column of a 6*6 seed matrix. That is, the decoder 30 updates original gain values 6, 7, 8, 9, or 10 to new gain values $6_1, 7_1, 8_1, 9_1$, or $10_1$, respectively, by using two gain values close to each other 6 and 7, 7 and 8, 8 and 9, 9 and 10, or 10 and 11. A gain value 11, however, of a sixth row is kept as it is.

When column directional decoding for each of 6 columns is done in such way, the decoder 30 performs row directional RNP decoding by using gain values $S_{A1}, S_{A2}, \ldots, S_{AB}$, which are updated by the above-described column directional RNP decoding, to calculate each of 13 gain values $G_{21}, G_{22}, \ldots G_{2N}$ forming a second row of an 11*13 grid matrix.

A process of decoding each of the gain values $G_{21}$, $G_{22}, \ldots, G_{2N}$ is substantially similar to a process of decoding each of the gain values $G_{11}, G_{12}, \ldots, G_{1N}$, therefore, a detailed explanation for the process is omitted.

After a process of decoding each of the gain values $G_{21}$, $G_{22}, \ldots, G_{2N}$ is finished, the decoder 30 performs column directional RNP decoding by using gain values forming each column.

After the column directional RNP decoding is completed, the decoder 30 performs row directional RNP decoding again by using gain values updated by the above-described column directional RNP decoding to calculate each of 13 gain values forming a third row of an 11*13 grid matrix.

As described above, the decoder 30 may calculate the 11*13 grid matrix from a 6*6 seed matrix by performing a row directional RNP decoding operation and a column directional RNP decoding operation repeatedly.

Finally, a plurality of decoded gain values expressed by the 11*13 grid matrix is stored in the gain memory 40.

Figure 6:
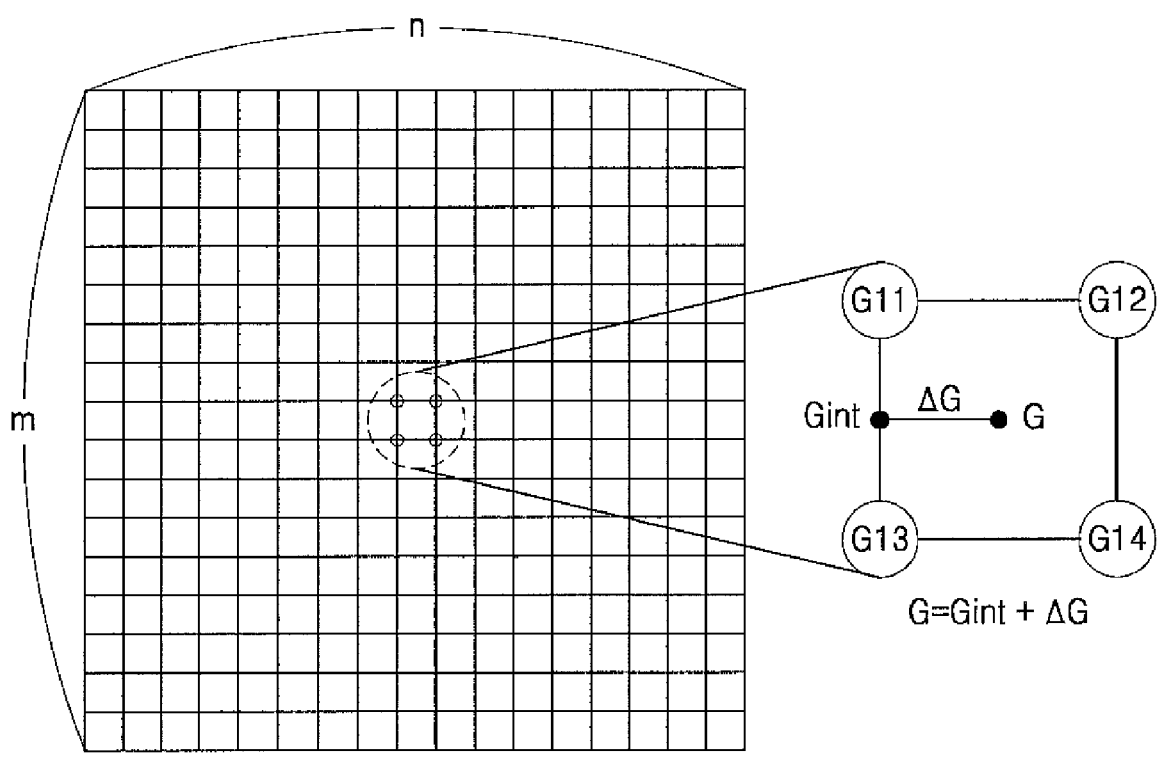
FIG. 6 shows an image divided into an m*n grid.

When a decoding process performed by the decoder 30 is all finished, the calculation block 50 corrects data DATA by using gain values stored in the gain memory 40 and outputs corrected data CDATA FIG. 6 shows an image divided to an m*n grid. Referring to FIG. 6, one image is divided to the m*n grid. Accordingly, the number of each point on the grid becomes (m+1)*(n+1). Each point represents a gain value. Here, M equals (m+1) and N equals (n+1). Where m and n are each a natural number.

For example, when an image is expressed by 1200*1000 in which m is 12 and n is 10, a grid includes 100*100 pixels. The grid as illustrated in FIG. 6 includes four gain values G11, G12, G13, and G14. Consequently, a gain value G of one pixel may be found by bilinear interpolation of the four gain values G11, G12, G13, and G14 surrounding the one pixel. For example, a gain value G may be calculated using a reference gain value Gint and a variation$\Delta$ G.

Figure 7:
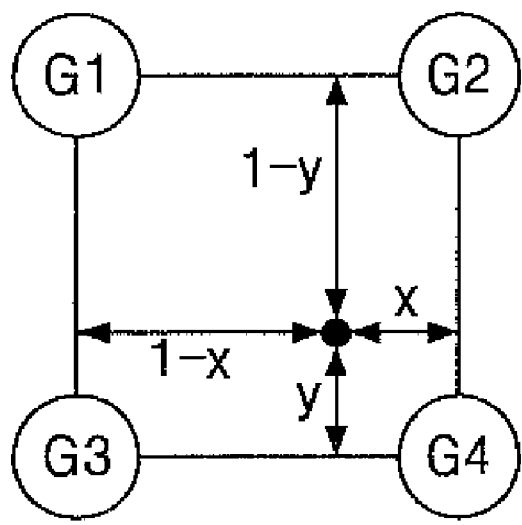
FIG. 7 is a conceptual diagram explaining bilinear interpolation used in a calculation block illustrated in FIG. 2.

FIG. 7 is a concept diagram for explaining bilinear interpolation used in a data processing apparatus such as illustrated in FIG. 2. The calculation block 50 illustrated in FIG. 2 corrects data DATA by performing bilinear interpolation using a plurality of gain values, for example, G1, G2, G3, and G4 output from the gain memory 40 as illustrated in FIG. 7.

The method for representing a lookup table (LUT) according to an exemplary embodiment of the present invention concerns a method for storing and restoring LUT values in a compressed form in an LUT that is sequentially accessed.

Figure 8:
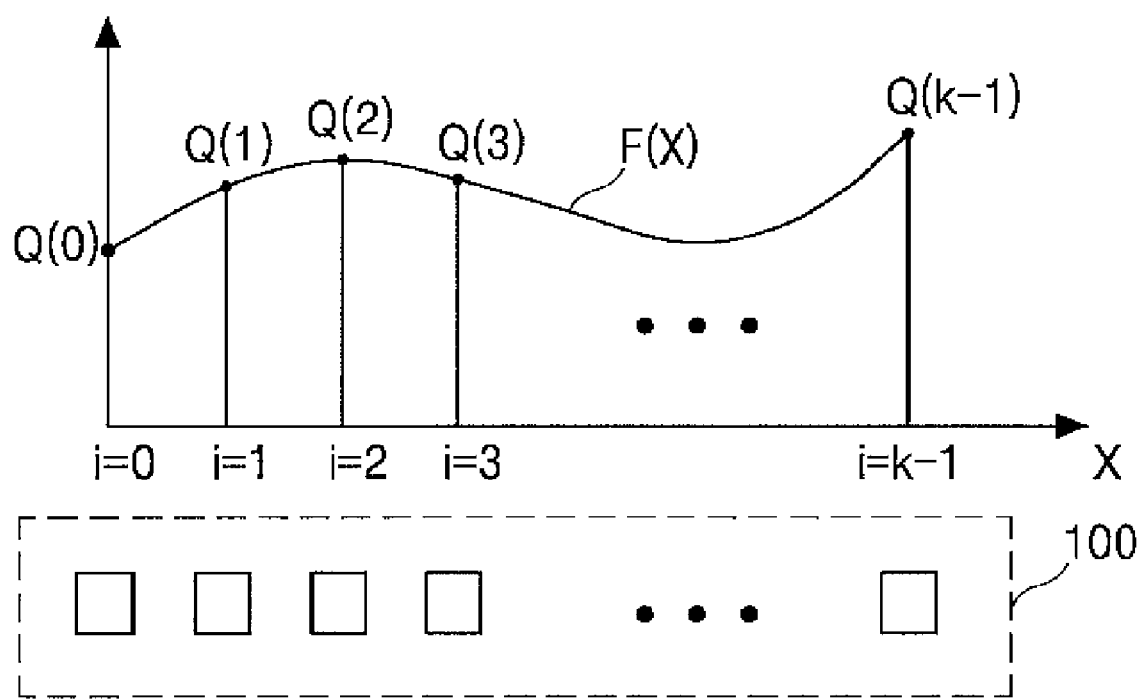
FIG. 8 is a one-dimensional lookup table representing an original function that is sequentially accessed.

FIG. 8 shows a one-dimensional LUT 100 that represents an original function F(x) and that is sequentially accessed. Referring to FIG. 8, $x = h(i) \cdot i$ where "i" denotes a sampling index of the original function F(x) and "h(i)" can be a constant or a variable.

The original function F(x) can be sampled at a regular or irregular interval. Each of the values Q(i) of the sampled original function, where i=0~(k−1) and "k" is a natural number, is the original LUT value to be stored in the one-dimensional LUT 100. The sequential access to the one-dimensional LUT 100 means that access to LUT data starts from the first element (i=0) of the one-dimensional LUT and proceeds in the right direction as "i" increases by 1.

When the original function is a smooth function, that is, it can be represented by polynomial regression with high precision, the capacity of a memory needed to store the original one-dimensional LUT values in the one-dimensional LUT 100 can be reduced by using RNP compression of the original LUT data into the initial seed vector. In this case, the polynomial regression to the original function is given by Equation 3, where M is natural number and $\alpha_i$ are real numbers $$F(x) \approx \sum_{i=0}^{M} +\alpha_i \cdot x^i \qquad \text{(Equation 3)}$$

According to an exemplary embodiment of present invention, this polynomial regression is represented as a solution of the Cauchy problem defined by Equations 4 and 5

$$\frac{d^{M+1}F}{dx^{M+1}} = 0 \qquad \text{(Equation 4)}$$

$$\left. \frac{d^i F}{dx^i} \right|_{x=0} = i!\alpha_i, \qquad \text{(Equation 5)}$$

Here, the initial conditions given by Equation 5 are the compressed representation of the original LUT data, which is referred to as initial seed vector.

The restoration of the LUT data, that is, the expansion of initial seed vector, is a process of numerical solution (integration) of the above described Cauchy problem. In an exemplary embodiment of present invention, the Cauchy problem is solved by means of an iterative Euler method of the first order, as shown by Equations 6 and 7.

$$\begin{bmatrix} F \\ \frac{dF}{dx} \\ \vdots \\ \frac{d^m F}{dx^m} \end{bmatrix}_{i+1} = \begin{bmatrix} F \\ \frac{dF}{dx} \\ \vdots \\ \frac{d^m F}{dx^m} \end{bmatrix}_i + \begin{bmatrix} \frac{dF}{dx} \\ \vdots \\ \frac{d^m F}{dx^m} \\ 0 \end{bmatrix}_i \cdot \Delta \qquad \text{(Equation 6)}$$

$$\begin{bmatrix} F \\ \frac{dF}{dx} \\ \vdots \\ \frac{d^m F}{dx^m} \end{bmatrix}_0 = \begin{bmatrix} \alpha_0 \\ 1!\alpha_1 \\ \vdots \\ m!\alpha_m \end{bmatrix}_i \qquad \text{(Equation 7)}$$

Here, $x = i \cdot \Delta$ and $F_i = F(i \cdot \Delta)$. "$\Delta$" denotes a convergence parameter and controls the accuracy of the numerical integration. "$\Delta$" can be a constant or variable. The convergence parameter "$\Delta$" has the same nature as h(j), that is, it can be a constant or a variable.

The function values with its derivatives obtained on the i-th step can be referred to as the i-th seed vector similarly to the initial seed vector, which we learn on the initial zero-th step. In these terms, the Equations 6 and 7 represent a recursive relationship between the current i-th seed vector and the (i−1)-th seed vector known from the previous step.

In a practical implementation, the iterative method given by Equations 6 and 7 is not exact. This means that during the process of restoration of the LUT data from the initial seed vector we obtain an approximation of the polynomial regression to the original function. The quality of the approximation depends upon the value of the convergence parameter "Δ" and the bit precision of numerical arithmetic used for the evaluation of Equations 6 and 7. That is why the method of compression of LUT data presented in the exemplary embodiment of the present invention is referred to as recursive near-polynomial compression.

The one-dimensional RNP equation represented by Equations 6 and 7 is linear with respect to the seed vector. That is, the i-th seed vector generated through the RNP expansion of initial seed vector obtained by adding of the first initial seed vector and the second initial seed vector equals the sum of the i-th seed vector generated through the RNP expansion of the first initial seed vector and the i-th seed vector generated through the RNP expansion of the second initial seed vector. Also, the result of the multiplication by a predetermined constant of the i-th seed vector generated through the RNP expansion of the first initial seed vector equals the i-th seed vector generated through the RNP expansion of the initial seed vector multiplied by the same constant $$RNP(S_1(0)+S_2(0),i)=RNP(S_1(0),i)+RNP(S_2(0),i) \quad \text{(Equation 8)}$$

$$C \times RNP(S(0),i)=RNP(C \times S(0),i) \quad \text{(Equation 9)}$$

The linear properties mentioned above are summarized as Equations 8 and 9, where $S(0)$ is the initial seed vector, $RNP(S(0),i)$ is the result of RNP expansion of the initial seed vector $S(0)$ on the i-th step, that is, i-th seed vector, C is the predetermined constant, $S_1(0)$ and $S_2(0)$ are the first and the second initial seed vectors, respectively.

The linear properties enable efficient control of the entire LUT table, which may contain vast amount of elements.

The RNP equations either in the form of Equations 6 or 7 can be realized without using the expensive operation of multiplication in a special case, when the convergence parameter "Δ" is a power of two using the binary operation of bit shift.

The multiplication-less operation increases performance of the software to restore the original LUT values from the initial seed vector and reduces the costs for the implementation of hardware.

According to an exemplary embodiment of the present invention, the method of computation of an initial seed vector to effectively approximate an original LUT is realized through the minimization of residual error between the original LUT data and the LUT data obtained through the RNP expansion of this initial seed vector. This process is referred to as RNP compression of the original one-dimensional LUT data into the initial seed vector.

In an exemplary embodiment of the present invention, the residual error is defined by Equation 10.

$$Err(S(0)) = \sum_i (RNP(S(0), i) - F(i \cdot \Delta))^2 \quad \text{(Equation 10)}$$

Here, $S(0)$ is the initial seed vector, and $RNP(S(0),i)$ is the result of RNP expansion of the initial seed vector $S(0)$ on the i-th step, that is, the approximation to the original function on the i-th step, and $F(i \cdot \Delta)$ is the value of the original function at point $i \cdot \Delta$.

According to the above definition, the residual error function has the initial seed vector as an argument. The optimal initial seed vector is obtained through the minimization of this function by a standard numerical method like Newton's method but is not limited thereto.

The restoration of the two-dimensional LUT from the initial seed matrix is apparent from the description introduced in the Summary" section hereinabove.

The compression of the two-dimensional LUT into the initial seed matrix can be implemented by adhering to the instructions described above for the case of one dimension except that Equation 10 should be rewritten as follows:

$$Err(S(0)) = \sum_{i,j} (RNP(S(0), i, j) - F(i \cdot \Delta_x, j \cdot \Delta_y))^2 \quad \text{(Equation 10b)}$$

Here, $S(0)$ is the initial seed matrix, $RNP(S(0),i,j)$ is the result of RNP expansion of the initial seed matrix $S(0)$ to obtain the element of the LUT with coordinates (i, j) and $F(i \cdot \Delta_x, j \cdot \Delta_y)$ is the original function value that corresponds to the LUT entry with coordinates (i,j).

An exemplary implementation of the present invention in the case of a one-dimensional LUT is presented below.

Figure 9:
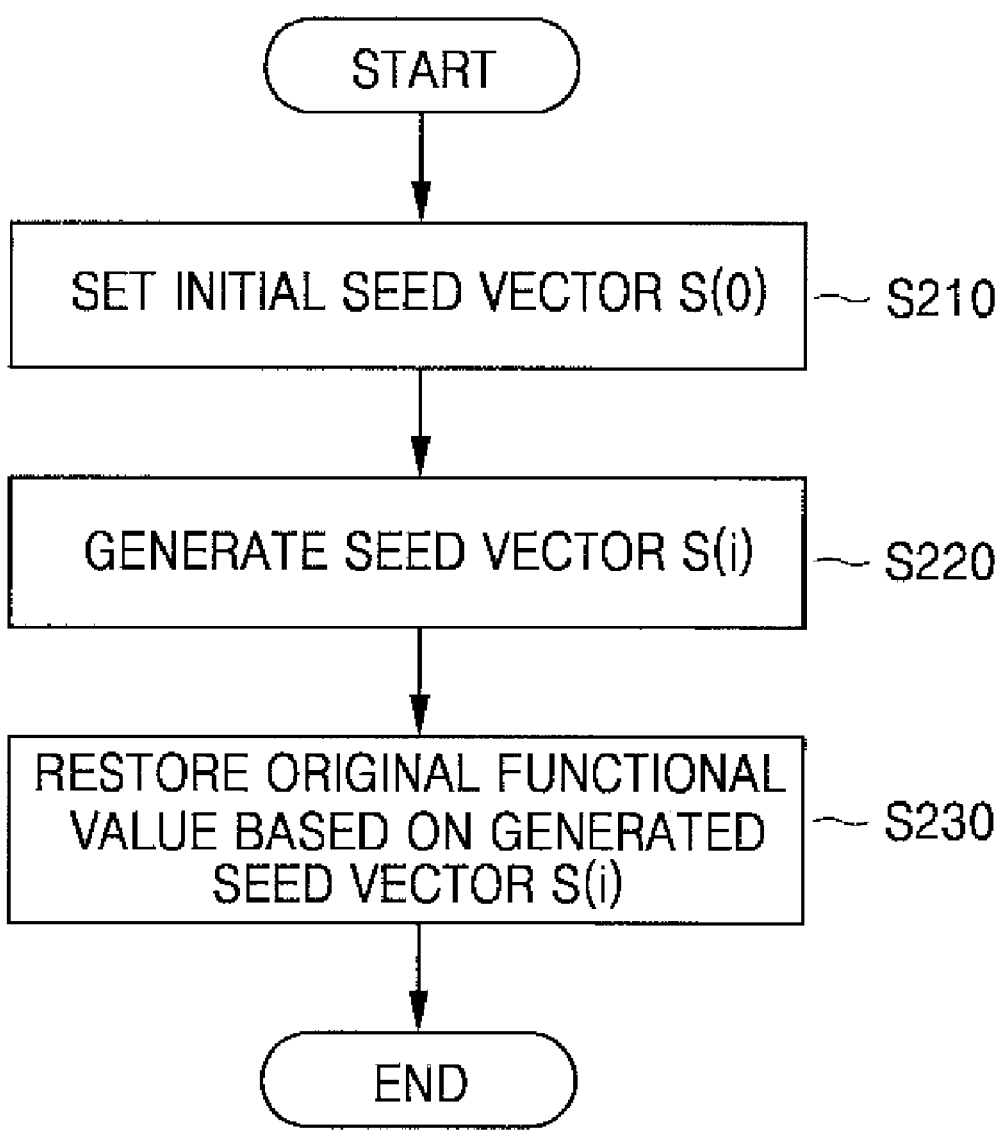
FIG. 9 is a flowchart showing a method for compressing and restoring values of the original one-dimensional lookup table to be stored in a compressed form according to an exemplary embodiment of the present invention.

FIG. 9 is a flowchart showing a method for restoring values $Q(i)$, $i=0\sim(k-1)$, of the original one-dimensional LUT to be stored as an initial seed vector $S(0)$ according to an exemplary embodiment of the present invention. The initial seed vector $S(0)$ set in step S210 corresponds to the initial condition for the Cauchy problem that defines a polynomial regression equation to compress the original one-dimension LUT values $Q(i)$, $i=0\sim(k-1)$, sampled from the original function $F(x)$.

The seed vectors $S(i)$, $i=0\sim(k-1)$ include a plurality of elements. For example, $S(i)=[S_0(i)\sim S_M(i)]$, $i=0\sim(k-1)$, where "M" is a natural number.

The seed vector $S(i)=[S_0(i)\sim S_M(i)]$, $i>0$ corresponding to the original one-dimensional LUT values $Q(i)$ is generated based on the initial seed vector $S(0)=[S_0(0)\sim S_M(0)]$ using Equations 11 and 12. According to the terminology introduced hereinabove, the process of computation of the seed vector $S(i)$ is the expansion of the initial seed vector $S(0)$ performed in step S220. The original functional value based on the generated seed vector $S(i)$ is then restored in step S230.

$$S_0(i)=S_0(0) \quad \text{(Equation 11)}$$

$$S_j(i)=S_j(i-1)+S_{j-1}(i-1) \times \frac{1}{2}^{k(j)} \quad \text{(Equation 12)}$$

In the above equations, $i=0\sim(k-1)$, "j" denotes the j-th element of the seed vector $S(i)$ and $j=1\sim M$. The factors $\frac{1}{2}^{k(j)}$ corresponds to the convergence parameter "Δ" introduced in Equation 4. These factors are intentionally chosen to be a power of two to improve performance of multiplication, as was described above.

Figure 10:
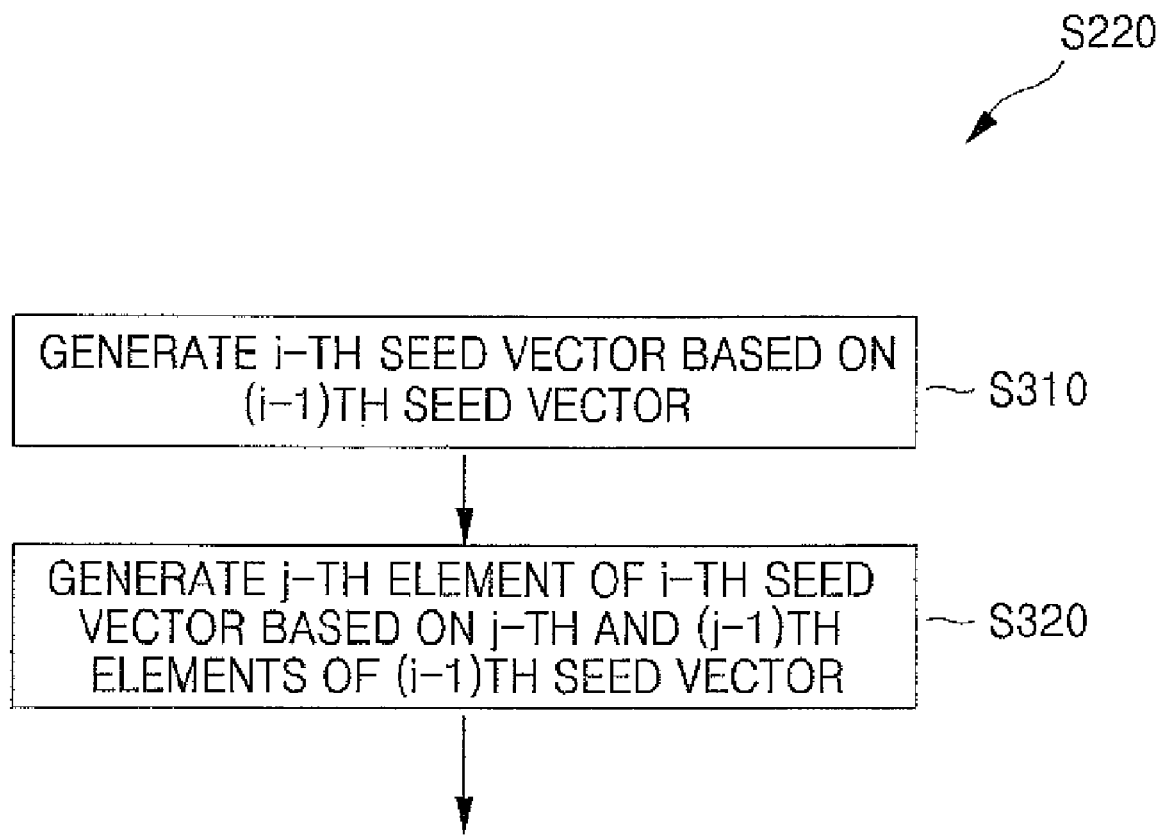
FIG. 10 is a flowchart showing the vector expansion operation of FIG. 9.

FIG. 10 is a flowchart showing the vector expansion operation performed in step S220 of FIG. 9. Referring to FIG. 10, the elements $S_j(i)$, $j=1\sim M$, of the i-th seed vector $S(i)$ corresponding to the i-th one-dimensional LUT value $Q(i)$ are generated based on the elements $S_j(i-1)$, $j=1\sim M$ of the (i-1)th seed vector $S(i-1)$ in step S310.

The seed vectors $S(i)$, $i=1\sim(k-1)$, are sequentially generated from the initial seed vector $S(0)$ according to Equation 12 in step S320. The corresponding original LUT value $Q(i)$ can be restored from the generated seed vectors $S(i)$, $i=1\sim(k-1)$ performed in step S230 of FIG. 9 by Equation 11.

$$Q(i)=S_M(i) \quad \text{(Equation 13)}$$

According to Equation 13, the original LUT value $Q(i)$ is the M-th element $S_M(i)$ of the seed vector $S(i)$, $i=1\sim(k-1)$. Consequently, the original one-dimensional LUT values $Q(i)$, $i=0\sim(k-1)$, can be compressed into the form of elements $S(0)=[S_0(0)\sim S_M(0)]$ of the initial seed vector $S(0)$ and restored as is the approximation to the original LUT by Equations 11-13.

The preferred implementation of the current invention in the case of a two-dimensional LUT is presented below.

Figure 11:
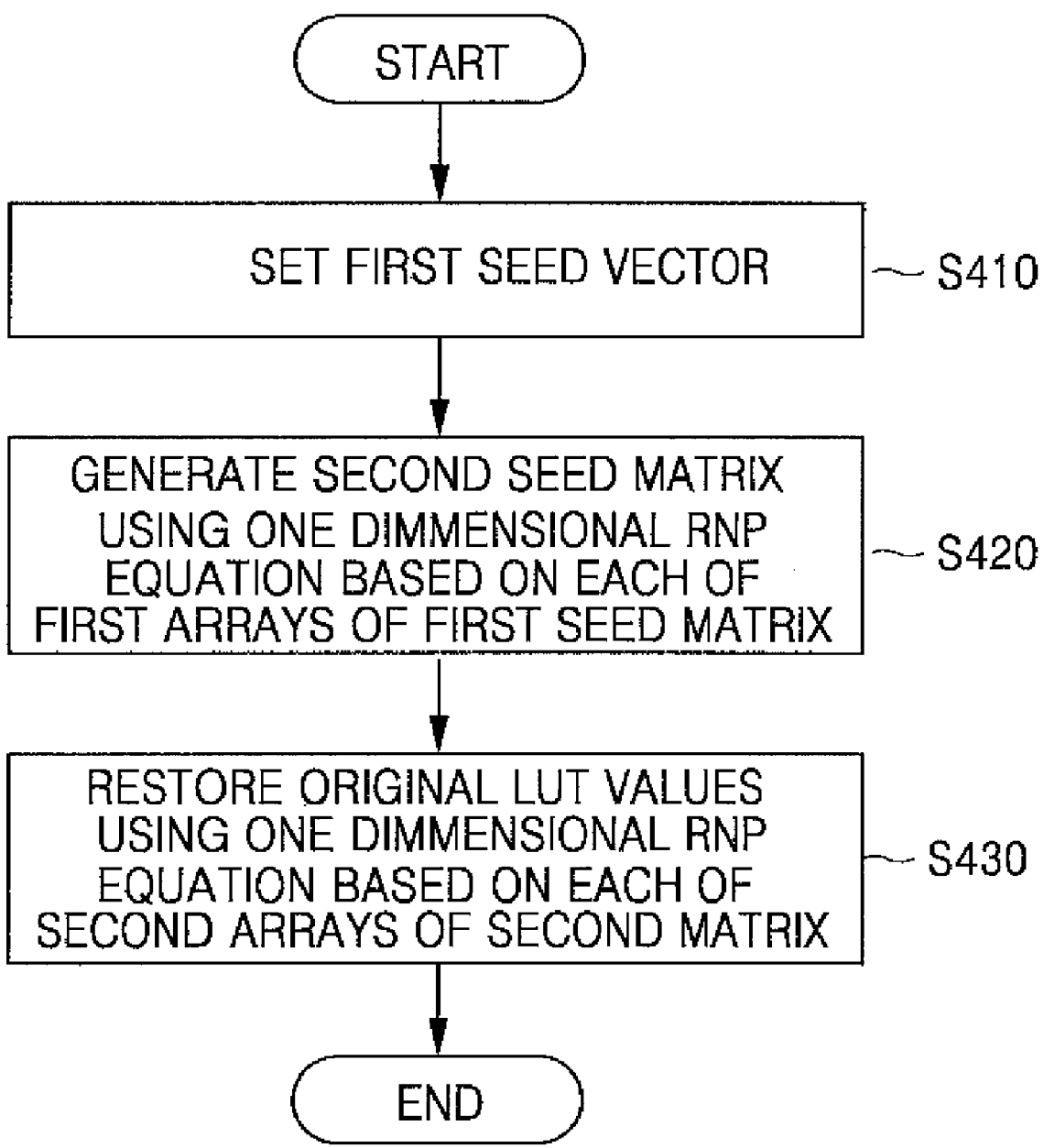
FIG. 11 is a flowchart for explaining a method for compressing and restoring values of the original two-dimensional lookup table to be stored in a compressed form according to an exemplary embodiment of the present invention.
Figure 12:
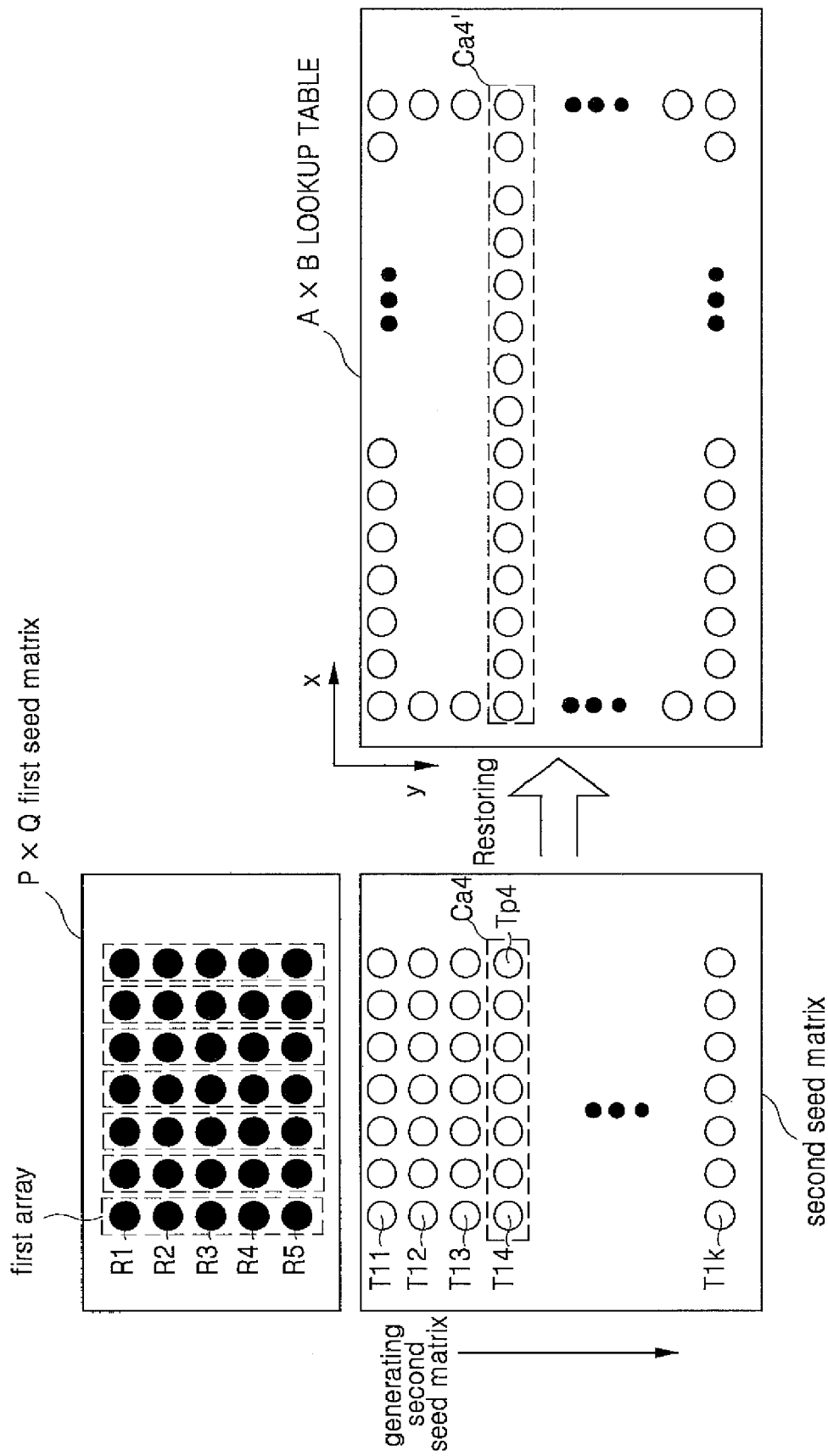
FIG. 12 is a flowchart for explaining the compression and restoring of the values of the two-dimensional lookup table according to an exemplary embodiment of the present invention.

FIG. 11 is a flowchart useful in explaining a method for restoring values of the original two-dimensional lookup table stored as elements of the first seed matrix according to an exemplary embodiment of the present invention. FIG. 12 is a representation useful in explaining the compression and restoring of the values of the two-dimensional lookup table according to an exemplary embodiment of the present invention.

Referring to FIGS. 11 and 12, the method for compressing and restoring values of the two-dimensional lookup table according an exemplary embodiment of the present invention utilizes an application of a cascaded one-dimensional RNP expansion process. The first seed matrix is a compressed representation of the elements of a two-dimensional LUT sampled from the original function F(x,y) having two arguments. Every column of the first seed matrix can be considered as the initial seed vector for the first stage of RNP expansion as in step S410.

The second seed matrix is generated using the one-dimensional RNP expansion of the first initial seed vector in step S410. This is referred to as the first one-dimensional RNP step as performed in step S420. For example, if the first initial seed vector is [R1, R2, R3, R4, and R5] a corresponding column array $[T_{11}]\sim[T_{1B}]$ of the second seed matrix can be generated using the one-dimensional RNP expansion.

The two-dimensional LUT can be restored by using the one-dimensional RNP expansion of the initial seed vector constructed from every row of the second seed matrix in step S430. This is referred to as the second one-dimension RNP step. For example, as shown in FIG. 12, by setting any corresponding row of the second seed matrix, for example, Ca4= $[T_{14}\sim T_{P4}]$, as a new initial seed vector, the corresponding LUT values, for example, Ca4', can be restored using the above-described one-dimensional RNP expansion.

As described above, because the LUT values can be restored from the PXQ first seed matrix using the cascaded one-dimensional RNP equation, the A×B LUT values can be compressed to a P×Q first seed matrix. Here, "P, Q, A, and B" are natural numbers. The LUT values can be restored line-by-line from top to bottom and from left to right.

The LUT values restored by the cascaded RNP expansion process described above approximate the two-dimensional polynomial regression given by Equation 12. The precision of the approximation can be controlled by the convergence parameter "Δ" in Equation 4 or "$1/2^{k(j)}$" in Equation 12.

$$F(x, y) = [1\, y\, \ldots\, y^{P-1}\, 1] \begin{bmatrix} \alpha_{11} & \alpha_{12} & \ldots & \alpha_{1Q} \\ \vdots & \vdots & \ldots & \vdots \\ \alpha_{P1} & \alpha_{P2} & \ldots & \alpha_{PQ} \end{bmatrix} \begin{bmatrix} 1 \\ x \\ \vdots \\ x^{Q-1} \end{bmatrix}$$ (Equation 14)

Here, "x" and "y" are respectively independent variables of the two-dimensional polynomial regression function F(x,y) and $$\begin{bmatrix} \alpha_{11} & \alpha_{12} & \ldots & \alpha_{1Q} \\ \vdots & \vdots & \ldots & \vdots \\ \alpha_{P1} & \alpha_{P2} & \ldots & \alpha_{PQ} \end{bmatrix}$$

is related to the first P×Q seed matrix.

FIG. 13 is a block diagram of a digital signal processor 600 for storing and restoring lookup table values according to an exemplary embodiment of the present invention. Referring to FIG. 13, the digital signal processor 600 includes a seed vector storing unit 610 and an RNP computation unit 620.

The seed vector storing unit 610 stores the compressed form of the LUT as an initial seed vector (or matrix in the case of two-dimensions). The seed vector storing unit 610 can be implemented by a non-volatile memory, for example, a flash memory or ROM, or a volatile memory, for example, a DRAM.

The RNP computation unit 620 expands the initial seed vector, for example, the one-dimension RNP equation, and restores the original function values. The RNP computation unit 620 includes the seed vector expansion unit 622 and an LUT value restoring unit 624. The seed vector expansion unit 622 generates seed vectors corresponding to each of the original function values based on the set initial seed vector S(0). The LUT value restoring unit 624 restores the corresponding LUT value based on seed vectors generated by the seed vector expansion unit 622.

The data processing apparatus according to an exemplary embodiment of the present invention has a small size and can decode transmitted information within a short period of time.

Although exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. A data processing apparatus comprising:
a seed memory for storing a plurality of encoded gain values forming an A*B seed matrix, where A and B are each a natural number;
a gain memory for storing a plurality of decoded gain values forming an M*N grid matrix, where M and N are each a natural number, M>A, N>B; and
a decoder, which is connected between the seed memory and the gain memory, and before decoding each of a plurality of decoded gain values forming an $i^{th}$, where i is a natural number, $2 \leq i \leq M$, row of the M*N grid matrix from a plurality of encoded gain values forming a first row of the A*B seed matrix, the decoder updates at least a part of the plurality of encoded gain values forming the A*B seed matrix based on two gain values close to each other in each column direction among the plurality of encoded gain values forming the A*B seed matrix.

2. The apparatus of claim 1, wherein the decoder decodes each of the plurality of decoded gain values forming the $i^{th}$ row, where i is a natural number, $2 \leq i \leq M$, of the M*N grid matrix from a plurality of encoded gain values, which are updated and form the first row of the A*B seed matrix.

3. The apparatus of claim 1, further comprising a calculation block for outputting data corrected by performing bilinear interpolation with regard to input data based on a plurality of reference gain values among the plurality of decoded gain values output from the gain memory.

4. The apparatus of claim 1, wherein the data processing apparatus is an apparatus performing lens correction and is embodied as a part of an image processing apparatus.

5. The apparatus of claim 1, wherein the decoder comprises:
B register blocks, which are connected in series and store a corresponding gain value among the plurality of encoded gain values respectively forming the first row and perform a data shifting operation in response to a clock signal;

a shift block shifting a first L-bit data, where L is a natural number, which is stored in a second register block among the B register blocks, as K-bit data, where K is a natural number, K<L, and outputting shifted first L-bit data;

an adder generating third L-bit data by adding the shifted first L-bit data and second L-bit data stored in a first register block among the B register blocks and outputting generated third L-bit data to a $B^{th}$ register block among the B register blocks; and a switching block outputting third L-bit data shifted to the first register block to the gain memory in response to a control signal output from a controller whenever the third L-bit data is shifted to the first register block through the data shifting operation.

6. A data processing apparatus comprising:

a plurality of register blocks, which are connected in series and are respectively capable of performing a data shifting operation;

a shift block shifting first L-bit data, where L is a natural number, which is stored in a second register block among the plurality of register blocks, as K-bit data, where K is a natural number and less than L, and outputting shifted first L-bit data;

an adder generating third L-bit data by adding the shifted first L-bit data and second L-bit data stored in a first register block among the plurality of register blocks and outputting generated third L-bit data to a last register block among the plurality of register blocks; and a switching block outputting a third L-bit data, which is shifted to the first register block, in response to a control signal output from a controller whenever the third L-bit data is shifted to the first register block through a data shifting operation.

7. The apparatus of claim 6, further comprising:

a seed memory storing a plurality of encoded gain values; and a gain memory storing a plurality of decoded gain values, wherein the controller controls storing a first set of gain values among the plurality of encoded gain values in the plurality of register blocks, and controls operation of the switching block by generating control signals until a second set of gain values among the plurality of decoded gain values is stored in the gain memory.

8. The apparatus of claim 7, wherein the controller further performs an operation of updating at least a part of the plurality of encoded gain values by using two gain values, which are adjacent each other in a column direction, among the plurality of encoded gain values, and, wherein the first set of gain values are gain values updated through the updating operation.

9. The apparatus of claim 7, further comprising a calculation block correcting input data based on a plurality of reference gain values among the plurality of decoded gain values output from the gain memory and outputting corrected data.

10. The apparatus of claim 7, further comprising a calculation block outputting data corrected by performing bilinear interpolation with regard to input data based on a plurality of reference gain values among the plurality of decoded gain values output from the gain memory.

11. A method for compressing and restoring one-dimensional data, the method comprising:

setting an initial seed vector corresponding to an initial condition for a Cauchy problem that defines a polynomial regression to compress a plurality of original function values sampled from an original function in a lookup table;

generating a seed vector corresponding to each of the original function values based on the set initial seed vector via a seed vector expansion operation; and restoring a corresponding original function value based on a corresponding seed vector of the seed vectors generated in the seed vector expansion operation.

12. The method of claim 11, further comprising setting the initial seed vector based on a residual difference between the restored function values and the corresponding original function values.

13. The method of claim 11, wherein, in the seed vector expansion operation, elements of an i-th seed vector corresponding to an i-th original function value are generated based on the initial seed vector and elements of an (i−1)th seed vector corresponding to an (i−1)th original function value, wherein "i" is a natural number.

14. The method of claim 13, wherein, in the seed vector expansion operation, a j-th element, wherein "j" is a natural number, of the elements included in the i-th seed vector is generated based on the j-th element and a (j−1)th element of the elements included in the (i−1)th seed vector.

15. The method of claim 14, wherein the seed vector expansion is realized by using an Euler method of first order.

16. A method for compressing and restoring two-dimensional data, the method comprising:

setting a first seed matrix to compress function values in a two-dimensional matrix form sampled from a function having two arguments;

generating a second seed matrix using a one-dimensional recursive near polynomial (RNP) expansion based on each of first arrays of the first seed matrix; and restoring the function values in the sampled two-dimensional matrix form using the one-dimension RNP expansion based on each of second arrays of the generated second seed matrix.

17. The method of claim 16, wherein the generating of the second seed matrix comprises:

setting each of the first arrays as a first initial seed vector; and generating the second seed matrix based on a corresponding RNP expansion of the first initial seed vectors.

18. The method of claim 17, wherein the restoring of the function values of the sampled two-dimensional matrix form comprises:

setting each of the rows of the generated second seed matrix as a second initial seed vector; and restoring function values in the two-dimensional matrix form based on the RNP expansion of the corresponding second initial seed vectors.

* * * * *